United States Patent
Deckers et al.

(10) Patent No.: US 10,151,987 B2
(45) Date of Patent: Dec. 11, 2018

(54) MEASURING METHOD, APPARATUS AND SUBSTRATE

(75) Inventors: David Deckers, Schilde (BE); Franciscus Godefridus Casper Bijnen, Valkenswaard (NL); Sami Musa, Veldhoven (NL)

(73) Assignee: ASML Netherlands B.V., Veldhoven (NL)

( * ) Notice: Subject to any disclaimer, the term of this patent is extended or adjusted under 35 U.S.C. 154(b) by 1522 days.

(21) Appl. No.: 13/306,668

(22) Filed: Nov. 29, 2011

(65) Prior Publication Data

US 2012/0133938 A1    May 31, 2012

Related U.S. Application Data

(60) Provisional application No. 61/418,193, filed on Nov. 30, 2010.

(51) Int. Cl.
  *G01N 21/86* (2006.01)
  *G03F 7/20* (2006.01)
  (Continued)

(52) U.S. Cl.
  CPC ............ *G03F 7/70683* (2013.01); *G03F 1/42* (2013.01); *G03F 1/44* (2013.01); *G03F 1/70* (2013.01);
  (Continued)

(58) Field of Classification Search
  CPC ..... G03F 1/42; G03F 1/44; G03F 1/70; G03F 7/70483
  (Continued)

(56) References Cited

U.S. PATENT DOCUMENTS 4,710,026 A * 12/1987 Magome ............. G03F 7/70633
                                                      356/400
5,182,610 A     1/1993 Shibata
                (Continued)

FOREIGN PATENT DOCUMENTS

CN    1534271    10/2004
EP    1862856    12/2007
            (Continued)

OTHER PUBLICATIONS

Singapore Office Action dated Jul. 25, 2013 in corresponding Singapore Patent Application No. 201108073-6.
(Continued)

*Primary Examiner* — Georgia Y Epps
*Assistant Examiner* — Kevin Wyatt
(74) *Attorney, Agent, or Firm* — Pillsbury Winthrop Shaw Pittman LLP

(57) ABSTRACT

A pattern formed on a substrate includes first and second sub-patterns positioned adjacent one another and having respective first and second periodicities. The pattern is observed to obtain a combined signal which includes a beat component having a third periodicity at a frequency lower than that of the first and second periodicities. A measurement of performance of the lithographic process is determined by reference to a phase of the beat component. Depending how the sub-patterns are formed, the performance parameter might be critical dimension (CD) or overlay, for example. For CD measurement, one of the sub-patterns may comprise marks each having of a portion sub-divided by product-like features. The measurement can be made using an existing alignment sensor of a lithographic apparatus. Sensitivity and accuracy of the measurement can be adjusted by selection of the first and second periodicities, and hence the third periodicity.

20 Claims, 7 Drawing Sheets

(51) Int. Cl.
    *G03F 1/42*     (2012.01)
    *G03F 1/70*     (2012.01)
    *G03F 1/44*     (2012.01)
    *G03F 9/00*     (2006.01)

(52) U.S. Cl.
    CPC ...... *G03F 7/70625* (2013.01); *G03F 7/70633* (2013.01); *G03F 9/7076* (2013.01); *G03F 9/7088* (2013.01)

(58) Field of Classification Search
    USPC .......... 216/59–60, 84–85; 250/492.1, 492.2, 250/492.21, 492.22, 559.01, 559.19, 250/559.27, 559.29, 559.3; 430/14–15, 430/302, 325–326, 333
    See application file for complete search history.

(56) References Cited

U.S. PATENT DOCUMENTS

| | | | |
|---|---|---|---|
| 5,751,426 A | 5/1998 | Nose et al. | |
| 6,034,378 A * | 3/2000 | Shiraishi | G03F 9/70 250/237 G |
| 6,151,121 A | 11/2000 | Mishima | |
| 6,297,876 B1 | 10/2001 | Bornebroek | |
| 6,961,116 B2 | 11/2005 | Den Boef et al. | |
| 7,330,261 B2 | 2/2008 | Van Haren et al. | |
| 7,714,981 B2 | 5/2010 | Onvlee et al. | |
| 7,818,073 B2 | 10/2010 | Heertjes | |
| 8,345,265 B2 | 1/2013 | Bijvoet | |
| 2002/0080364 A1 | 6/2002 | Monshouwer et al. | |
| 2004/0051872 A1 * | 3/2004 | Blidegn | 356/400 |
| 2004/0114143 A1 | 6/2004 | Van Haren et al. | |
| 2004/0129900 A1 * | 7/2004 | Den Boef | G03F 9/7046 250/559.3 |
| 2005/0123844 A1 * | 6/2005 | Monshouwer | G01B 11/27 430/22 |
| 2005/0202327 A1 * | 9/2005 | Goodwin | 430/30 |
| 2006/0019180 A1 * | 1/2006 | Nomura | 430/5 |
| 2006/0187434 A1 * | 8/2006 | Sogard | G03F 9/7026 355/55 |
| 2007/0108368 A1 * | 5/2007 | Mieher et al. | 250/201.2 |
| 2007/0146670 A1 * | 6/2007 | Kruijswijk | 355/55 |
| 2007/0250187 A1 | 10/2007 | Heertjes | |
| 2008/0100819 A1 | 5/2008 | Onvlee et al. | |
| 2008/0259353 A1 * | 10/2008 | Miyashita | 356/601 |
| 2008/0291413 A1 | 11/2008 | Steijaert et al. | |
| 2009/0135389 A1 | 5/2009 | Hofmans et al. | |
| 2009/0195768 A1 | 8/2009 | Bijnen et al. | |
| 2010/0129741 A1 | 5/2010 | Bijvoet | |
| 2012/0212749 A1 * | 8/2012 | Den Boef | G02B 21/0048 356/615 |

FOREIGN PATENT DOCUMENTS

| | | |
|---|---|---|
| JP | S61-215905 | 9/1986 |
| JP | H02-283011 | 11/1990 |

OTHER PUBLICATIONS

European Search Report and Search Opinion dated Jul. 21, 2017 in corresponding European Patent Application No. 11186981.4.

* cited by examiner

MEASURING METHOD, APPARATUS AND SUBSTRATE

CROSS-REFERENCE TO RELATED APPLICATION

This application claims priority and benefit under 35 U.S.C. § 119(e) to U.S. Provisional Patent Application No. 61/418,193, entitled "Measuring Method, Lithographic Apparatus, Substrate, and Device Manufacturing Method," filed on Nov. 30, 2010. The content of that application is incorporated herein in its entirety by reference.

FIELD

The present invention relates to a measuring method, a lithographic apparatus, and a substrate. The method may be applied to the measurement of performance of a lithographic process, for example to measure critical dimension or overlay performance.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In order to monitor the lithographic process, parameters of the patterned substrate are measured. Parameters may include, for example, the overlay error between successive layers formed in or on the patterned substrate, and critical linewidth (critical dimension commonly abbreviated to CD). Overlay and CD can be measured in photosensitive resist (after exposure and before or after development), or in actual product features formed by etching, deposition and the like. These measurements may be performed on a product substrate and/or on a dedicated metrology target. There are various techniques for making direct measurements of the microscopic structures formed in lithographic processes, including the use of scanning electron microscopes and various specialized tools. A fast and non-invasive form of specialized inspection tool is a scatterometer in which a beam of radiation is directed onto a target on the surface of the substrate and properties of the scattered or reflected beam are measured. By comparing the properties of the beam before and after it has been reflected or scattered by the substrate, the properties of the substrate can be determined. This can be done, for example, by comparing the reflected beam with data stored in a library of known measurements associated with known substrate properties.

Compared with electron microscopy, scatterometry is enabling relatively rapid measurement of CD and overlay to be performed in an instrument which is closely integrated within the lithographic production cell or cluster. The results of these measurements can be fed back, or fed forward into control systems of the lithographic apparatus or other processing tools, so as to adjust performance more interactively. Scatterometry nevertheless generally makes use of a complex and computationally demanding instrument that is provided next to the lithographic apparatus itself. The lithographic apparatus, though it contains very accurate metrology systems for positioning and mapping the substrate and patterning device to place all parts of the applied pattern at their desired positions, usually does not directly measure overlay or CD.

Depending on the application, control of overlay and CD may be critical to good performance of the manufactured device. In the highest density structures, made today by double patterning techniques, it can be important not only to keep CD within a certain range, but also to match the CD achieved in different process steps.

SUMMARY

A method of metrology is provided which can among other parameters measure CD and overlay using sensors of the type commonly used for positional measurements in the lithographic apparatus itself. The existing instruments can be used for these new purposes, by modifying the marks formed on a substrate, and by modifying the data processing of output signals of the sensors.

According to a first aspect of the invention there is provided a method of measuring a parameter of performance of a lithographic process, the method comprising:
(a) forming a pattern on a substrate using at least one lithographic step, the pattern including first and second sub-patterns positioned adjacent one another on the substrate and having respective first and second periodicities;
(b) making observations of the adjacent first and second sub-patterns to obtain a combined signal including a beat component having a third periodicity at a frequency lower than that of the first and second periodicities; and
(c) calculating from said combined signal a measurement of performance of the lithographic process, the calculated measurement being determined at least partially by a phase of the beat component.

Depending how the sub-patterns are formed, the performance parameter might be critical dimension (CD) or overlay, for example. For CD measurement, one of the sub-patterns may comprise marks each having of a portion sub-divided by product-like features. For overlay measurement, the sub-patterns are formed in separate lithographic steps.

The measurement can be made using an existing alignment sensor of a lithographic apparatus, and may be used to control an imminent lithographic step. Sensitivity and accuracy of the measurement can be adjusted by selection of the first and second periodicities, and hence the third periodicity.

Another aspect of the invention further provides apparatus for measuring a parameter of performance of a lithographic process, the apparatus comprising:
a sensor operable to observe a pattern on formed on a substrate using said lithographic process, the pattern including first and second sub-patterns positioned adjacent one another on the substrate and having respective first and second periodicities;

an arrangement for combining observations of the adjacent first and second sub-patterns to obtain a combined signal including a beat component having a third periodicity at a frequency lower than that of the first and second periodicities; and a processor for calculating from said combined signal a measurement of performance of the lithographic process, the calculated measurement being determined at least partially by a phase of the beat component.

In an embodiment, the invention further provides a lithographic apparatus arranged to transfer a pattern from a patterning device onto a substrate, the apparatus comprising a substrate table constructed to hold a substrate, and a measuring apparatus according to the invention as set forth above, arranged for measuring a parameter of performance of a lithographic process to which said substrate has been subjected while said substrate is supported on the substrate table of the lithographic apparatus.

The sensor of the measuring apparatus may also be used to measure a position of the substrate and the lithographic apparatus may include a controller for controlling the transfer of a subsequent pattern onto the substrate at least partly by reference to the measured position.

In another aspect, an embodiment yet further provides a substrate whereon a mark has been formed by a lithographic process, the mark being adapted for use in measuring a parameter of performance of the lithographic process and comprising first and second sub-patterns positioned adjacent one another on the substrate and having respective first and second periodicities, wherein said sub-patterns are formed such that an apparent position of one sub-pattern relative to the other sub-pattern is dependent on said performance parameter, and wherein said first and second periodicities are such as to generate a beat pattern having a third periodicity at a frequency lower than that of the first and second periodicities, whereby variation of said performance parameter can be inferred a variation in the position of the beat pattern.

In another aspect, an embodiment yet further provides a tangible computer program product comprising machine executable instructions for causing a measuring apparatus to perform steps (b) and (c) of a method according to the invention as set forth above.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
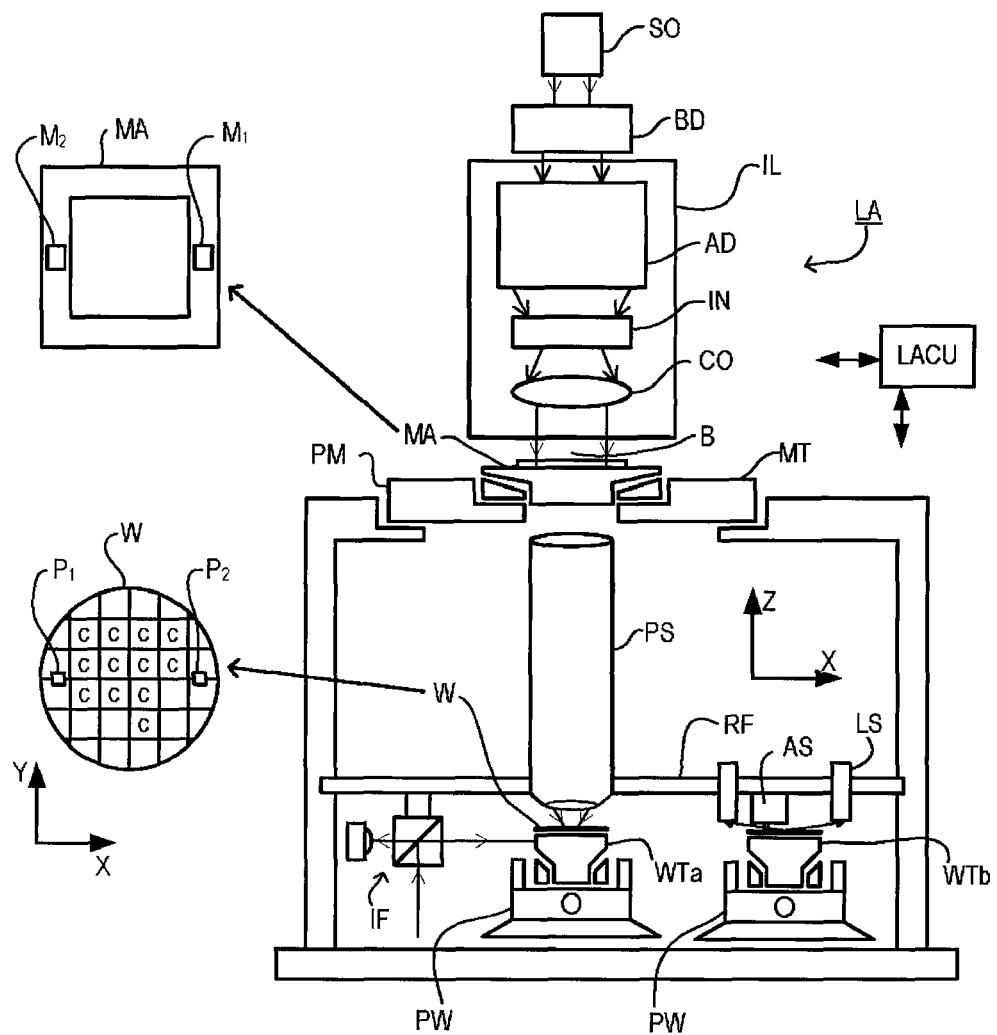
FIG. 1 depicts a lithographic apparatus according to an embodiment of the invention.

FIG. 1 schematically depicts a lithographic apparatus LA according to one embodiment of the invention. The apparatus comprises:

an illumination system (illuminator) IL configured to condition a radiation beam B (e.g. UV radiation or EUV radiation).

a support structure (e.g. a mask table) MT constructed to support a patterning device (e.g. a mask) MA and connected to a first positioner PM configured to accurately position the patterning device in accordance with certain parameters;

a substrate table (e.g. a wafer table) WTa/WTb constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable minor array employs a matrix arrangement of small minors, each of which can be individually tilted so as to reflect an incoming radiation beam in different directions. The tilted minors impart a pattern in a radiation beam which is reflected by the minor matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure. An example will be described below, with reference to FIG. 10. The invention disclosed herein can be used in a stand-alone fashion, but in particular it can provide additional functions in the pre-exposure measurement stage of either single- or multi-stage apparatuses.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing minors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WTa/WTb can be moved accurately, e.g. so as to position different target portions C in the path of the radiation beam B. Similarly, the first positioner PM and another position sensor (which is not explicitly depicted in FIG. 1) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WTa/WTb may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WTa/WTb are kept essentially stationary, while an entire pattern imparted to the radiation beam is projected onto a target portion C at one time (i.e. a single static exposure). The substrate table WTa/WTb is then shifted in the X and/or Y direction so that a different target portion C can be exposed. In step mode, the maximum size of the exposure field limits the size of the target portion C imaged in a single static exposure.

2. In scan mode, the mask table MT and the substrate table WTa/WTb are scanned synchronously while a pattern imparted to the radiation beam is projected onto a target portion C (i.e. a single dynamic exposure). The velocity and direction of the substrate table WTa/WTb relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WTa/WTb is moved or scanned while a pattern imparted to the radiation beam is projected onto a target portion C. In this mode, generally a pulsed radiation source is employed and the programmable patterning device is updated as required after each movement of the substrate table WTa/WTb or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Lithographic apparatus LA is of a so-called dual stage type which has two substrate tables WTa and WTb and two stations—an exposure station and a measurement station—between which the substrate tables can be exchanged. While one substrate on one substrate table is being exposed at the exposure station, another substrate can be loaded onto the other substrate table at the measurement station and various preparatory steps may be carried out. The preparatory steps may include mapping the surface of the substrate using a level sensor LS and measuring the position of alignment markers on the substrate using an alignment sensor AS. This enables a substantial increase in the throughput of the apparatus. If the position sensor IF is not capable of measuring the position of the substrate table while it is at the measurement station as well as at the exposure station, a second position sensor may be provided to enable the positions of the substrate table to be tracked at both stations.

The apparatus further includes a lithographic apparatus control unit LACU which controls all the movements and measurements of the various actuators and sensors described. LACU also includes signal processing and data processing capacity to implement desired calculations relevant to the operation of the apparatus. In practice, control unit LACU will be realized as a system of many sub-units, each handling the real-time data acquisition, processing and control of a subsystem or component within the apparatus. For example, one processing subsystem may be dedicated to servo control of the substrate positioner PW. Separate units may even handle coarse and fine actuators, or different axes. Another unit might be dedicated to the readout of the position sensor IF. Overall control of the apparatus may be controlled by a central processing unit, communicating with these sub-systems processing units, with operators and with other apparatuses involved in the lithographic manufacturing process.

Figure 2:
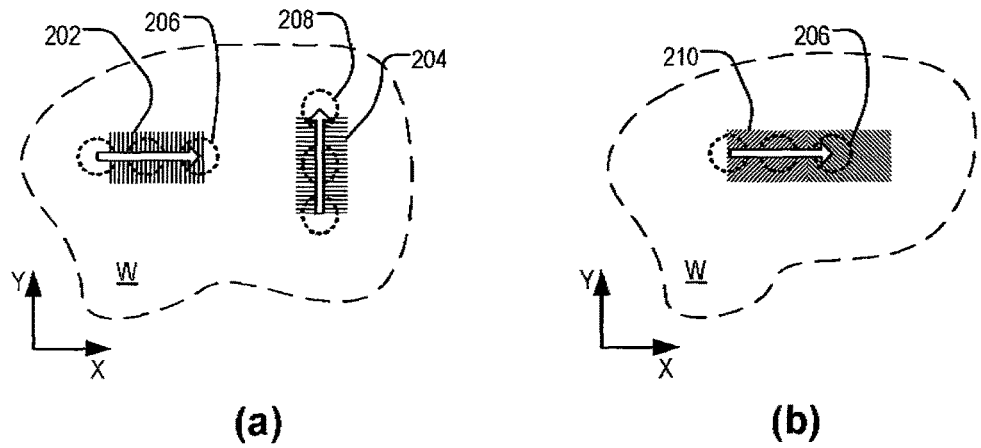
FIG. 2 illustrates various forms of an alignment mark that may be provided on a substrate in the apparatus of FIG. 1.

FIG. 2 shows examples of alignment marks 202, 204, provided on substrate W for the measurement of X-position and Y-position, respectively. Each mark in this example comprises a series of bars formed in a product layer or other layer applied to or etched into the substrate. The bars on the X-direction mark 202 are parallel to the Y-axis, while the bars of the Y-direction mark 204 are parallel to the X-axis. The alignment sensor AS (shown in FIG. 1) scans each mark optically with a spot 206, 208 of radiation, to measure the position of substrate W relative to the apparatus. The pitch of the bars in the alignment pattern is typically much greater than the pitch of product features to be formed on the substrate, and the alignment sensor AS uses a wavelength of radiation (or usually plural wavelengths) much longer than the exposure radiation to be used for applying patterns to the substrate. Fine position information can be obtained, however, because the large number of bars allows the phase of the repeating pattern to be accurately measured.

Coarse and fine marks may be provided, so that the alignment sensor can calculate which cycle of the pattern is at a given position, as well as the exact position (phase) within that cycle. Marks of different pitches can also be used for this purpose. These techniques are again well known to the person skilled in the art, and will not be detailed herein. The design and operation of such sensors is well known in the art, and each lithographic apparatus has its own design of sensor. For the purpose of the present description, it will be assumed that the alignment sensor AS comprises an alignment system of the form described in U.S. Pat. No. 6,961,116 (den Boef). FIG. 2(b) shows a modified mark for use with a similar alignment system, which X- and Y-positions can be obtained through a single scan. The mark 210 has bars arranged at 45 degrees to both the X- and Y-axes. This combined X- and Y-measurement can be performed using the techniques described in published patent application US 2009195768 A (Bijnen et al), the contents of which are incorporated herein by reference. It may be noted that US '768 discloses some embodiments in which the X-Y alignment marks have portions of different pitches, somewhat similar to the marks newly presented in the present application. However, the simpler mark shown in FIG. 2(b) is the form generally used in the commercial embodiment, and any moiré effect that may be observed between different pitches in the embodiments of US '768 is fixed and provides no measure of process performance.

Figure 3:
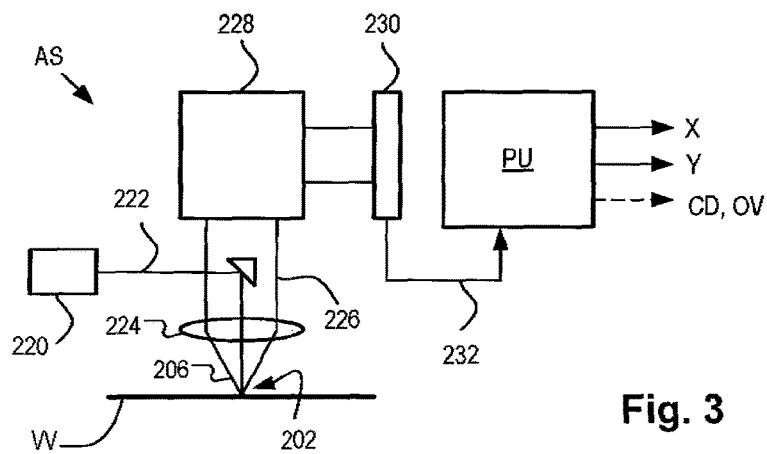
FIG. 3 is a schematic block diagram of an alignment sensor in the apparatus of FIG. 1.

FIG. 3 is a schematic block diagram of alignment sensor AS. Illumination source 220 provides a beam 222 of radiation of one of more wavelengths, which is diverted through an objective lens 224 onto a mark such as mark 202, located on substrate W. As indicated schematically in FIG. 2, in the example of the present alignment sensor based on U.S. Pat. No. 6,961,116, mentioned above, the illumination spot 206 by which the mark 202 is illuminated may be slightly smaller in diameter then the width of the mark itself.

Radiation scattered by mark 202 is picked up by objective lens 224 an collimated into an information-carrying beam 226. An optical analyzer 228 processes beam 226 and outputs separate beams onto a sensor array 230. Intensity signals 232 from individual sensors in sensor grid 230 are provided to a processing unit PU. By a combination of the optical processing in the block 228 and the computational processing in the unit PU, values for X- and Y-position on the substrate relative to the sensor are output. In accordance with embodiments of the invention, described further below, processing unit PU in the novel apparatus disclosed herein also can output critical dimension (CD) and/or overlay (OV) measurements from the same substrate W. This is achieved by use of modified marks and modified signal/data processing. Processing unit PU may be separate from the control unit LACU shown in FIG. 1, or they may share the same processing hardware, as a matter of design choice and convenience. Where unit PU is separate, part of the signal processing may be performed in the unit PU and another part in unit LACU.

Figure 4:
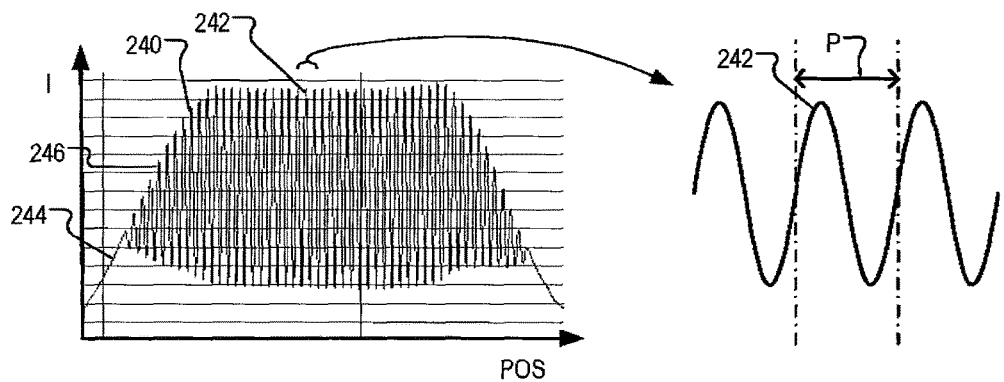
FIG. 4 illustrates signals obtained and processed by the alignment sensor of FIG. 3.

FIG. 4 illustrates schematically some signals and signal processing performed by alignment sensor AS in the known apparatus, for measuring X, Y positions. The graph at the left hand side is a trace 240 of sampled values of intensity I against scan position POS, when radiation is picked up by sensor 230 as spot 206 is scanned along mark 202. The scan position POS may be X position, Y position or any direction according to the direction of scanning. If the scan is performed at a certain linear velocity, then the variation with scan position corresponds to a variation of an electrical signal in time. The signals can represent the analog intensity value in analog form, but are translated to digital form for ease of processing. In this trace, a central portion comprises a large number of peaks 242, whose spacing corresponds to the spacing of the individual bars in the target pattern 202. A smooth portion of the trace at 244 indicates the scanning of an area outside the mark, while an intermediate portion 246 corresponds to the time in which spot 206 is gradually coming over the mark and the periodic signal builds to its peak amplitude. Due to the length of the mark and the relatively smaller size of the spot, a large central portion of the trace shows peaks 242 and troughs of relatively steady amplitude. The enlarged detail at the right hand side in FIG. 4 shows a portion of the trace 240 in the central portion, with peak 242 highlighted. The trace in this portion has approximately a sine wave form. A period P of the sine wave is indicated, which corresponds to the pitch of the line pattern in the alignment mark 202. The pitch of the mark is well-known. Therefore, by mathematically fitting a sine curve of the appropriate frequency to the trace 240 over a large number of cycles provided, a very accurate phase measurement can be made, which in turn enables an accurate position measurement. The same process can be repeated at different wavelengths for increased accuracy, and for robust detection of the mark irrespective of the materials from which the mark is made. The wavelengths can be multiplexed and demultiplexed optically so as to be processed simultaneously, and/or they may be multiplexed by time division.

As mentioned already, the particular measurement illustrated only fixes the position of the mark within a certain range corresponding to one pitch of the mark. Coarser measurement techniques are used in conjunction with this, to identify which period of the sine wave is the one containing the marked position.

Figure 5:
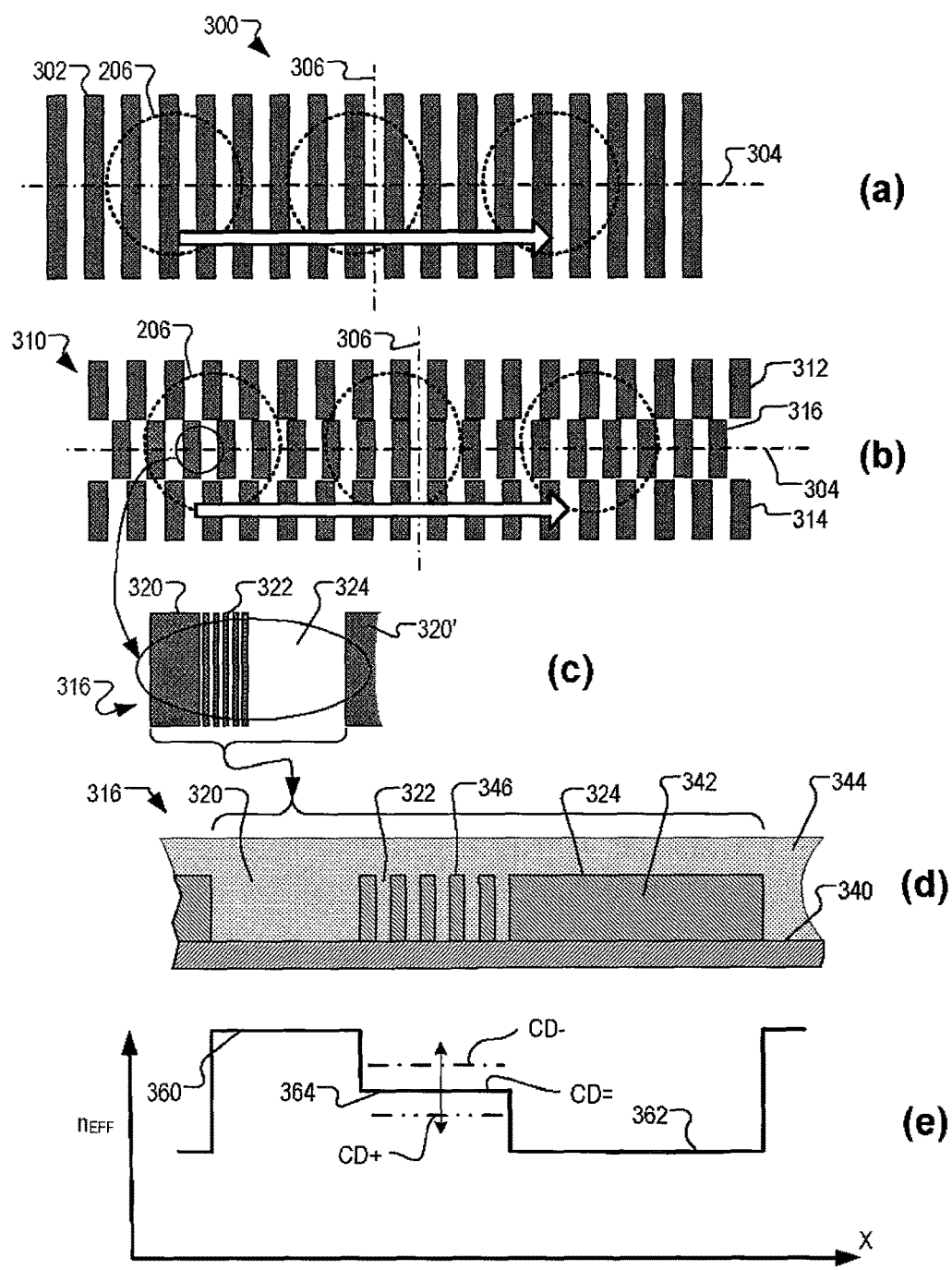
FIG. 5 illustrates in enlarged detail (a) the form of one of the marks shown in FIG. 2, (b) the form of a modified mark for use in measuring CD in an embodiment of the invention, (c) an enlarged detail of part of the mark, (d) a further enlarged cross-sectional detail of the portion shown at (c), and (e) a graph of effective refractive index of the mark detail shown at (d)

FIG. 5(a) illustrates a mark 300 of known type, for comparison, which may for example be the mark 202 or 204 shown in FIG. 2 and FIG. 3. Mark 300 comprises a number of bars 302 arranged perpendicular to a longitudinal axis 304 of the mark, while the bars 302 are arrayed symmetrically about and parallel to a transverse axis 306. Symmetry of the mark about these axes 304, 306 is important for the functioning of the particular type of sensor described in U.S. Pat. No. 6,961,116, in which the optical analyzer 228 forms a pair of images of the mark, rotated 180 degrees relative to one another. Symmetry may not be important in embodiments using other types of sensor, giving more freedom in the design of the mark. Again, scanning spot 206 is indicated by a dotted circle, progressing across the mark during the scan operation.

FIG. 5(b) shows a novel mark, based on the known mark 300, but incorporating modifications to allow it to serve to measure CD in accordance with an embodiment of the invention. Where the conventional mark 300 comprises bars 302 extending across its full width, bars in the new mark are subdivided into three sections. In outer sections of mark 310, running parallel to longitudinal axis 304, a number of bars 312 and 314 are provided, which are identical to the outer portions of bars 302 in the conventional mark. In the central portion, running symmetrically along the longitudinal axis 304, a number of bars 316 are formed. The number of bars 316 have a pitch which is different from the pitch of the number of bars 312 and 314. As will be seen below, this results in the scanning spot 206 receiving a 'beat' signal, effectively forming a moiré pattern as signals from the two different pitches interfere constructively and destructively in the optical system of the sensor AS. The provision of different portions of the mark pattern having different pitches of repetition so as to form a moiré pattern when combined is a first feature which distinguishes mark 310 from the known mark 300.

FIG. 5(c) shows a further feature which distinguishes mark 300 from the known mark. One of the bars 316 of the central portion of mark 310 is shown in enlarged detail, and can be seen to comprise a solid portion 320 and a subdivided portion comprising a number of finer bars 322. The space between marks is labeled 324, for comparison. The next bar in the pattern is labeled 320'. The individual bars 322 in the subdivided portion of modified bar 316 are referred to as product-like features, because they are formed with dimensions similar to product feature dimensions, rather than the larger dimension of the alignment bars 302, 312 etc. For example, in a modern lithographic process, the smallest product features may be 50 nm across. Consequently, these smaller features are formed so as to have the critical dimension, shared with product features across the substrate, which it is designed to measure. It should be noted that the number of bars in the marks 300 and 310, and the number of subdivided features 322 within each bar 316 will be much greater than that shown in the drawings, which have been simplified for ease of illustration. Where the present example shows the central portion of mark 310 having the subdivided bars, it would also be possible to put the subdivided bars in the outer portions of mark 310 (i.e. in the bars 312 and 314), or even in both the outer portions 312 and 314 and the inner portion 316 of mark 310, provided their positions are reversed so as to enhance, not cancel out, the desired effects (explained below). The mark-space ratio in the subdivided bars may be varied away from the 50:50 illustrated. An option would be to extend the chopped portion a little further into the space portion 324, so as to bring the effective position of the inner mark, when CD is at its nominal value—closer to a zero value. This is not critical, however, and in any case the effective position of the same mark pattern will vary according to the layer thicknesses and materials from which it is formed.

FIG. 5(d) shows the partially subdivided bar 316 in cross section. For the sake of example, three different materials are shown. An underlying layer 340, a product layer 342 in which CD is to be measured, and an overlying layer 344. The skilled reader will appreciate that many different possibilities exist for the makeup of these layers. Materials 340 and 342 may in fact be differently etched portions of the same material, which may be a special layer or simply the substrate material. Layer 344 may be for example a resist layer. In the form of the modified bar 316 which is illustrated in FIG. 5(d), the solid portion of 320 is formed by a gap in material 342, and the subdivided bars 322 are similarly formed by narrower gaps in material 342. 346 indicate spaces between the subdivided bars. This is for the sake of example and illustration only, and they may be defined the other way around without affecting the principles of the invention to be described. The critical dimension CD can be defined as the width of these features 346, or the width of the gaps 322 between them, as a matter of choice. Naturally the same physical variation would be reported as a positive or a negative CD variation, depending on the definition chosen.

FIG. 5(e) is a graph showing the effective refractive index $n_{\it eff}$ of the material shown in FIG. 5(d) against the X position, corresponding to the different portions of the modified bar 316 shown in FIG. 5(d) above it. In the portion of the graph labeled 360, the effective refractive index is relatively high, corresponding broadly to the refractive index of material 344. The portion of the graph labeled 362 conversely shows the refractive index of material 342, or combination of material 342 and overlying material 344, in the solid portion 324. Because the wavelengths of light in the measurement spot 206 are several times longer than the critical dimension of the smaller marks, these are not resolved into individual portions. Therefore in the intermediate portion, where the subdivided bars 322 and spaces 346 are found, the effective refractive index at level 364 depends on a combination of the materials forming the mark, and in this example is intermediate between the levels at 360 and 362.

The solid line at portion 364 indicates this average level when the CD is at a nominal value. If the CD of an actual sample should vary, however, the relative widths of the subdivided marks 322 and spaces 346 will vary from their nominal ratio. Consequently, the effective refractive index in this portion of the modified bar 316 will vary up or down, as indicated by the double-headed arrow. For the sake of this illustration, and labeling the level 364 "CD=" to represent the nominal CD value, a dot dash line labeled "CD−" indicates the upward shift in effective refractive index caused by a reduction in CD from the nominal value. Similarly, a double dot dash line labeled "CD+" which indicates a reduction in the effective refractive index caused by a CD value higher than the nominal value.

The skilled reader will appreciate that there are many alternative ways to define the mark and space in the marks and spaces in the bar patterns 312, 314, 316, and that the naming of mark and space is somewhat arbitrary in practice. Similarly, it may be that the refractive index of the mark is higher than that of the space, or vice versa. The subdivided portions of modified bar patterns may be provided in the mark portion or the space portion, of the larger pattern. Depending on all these design choices, and arrangement of materials the graph plotted in 305(e) may vary. The common feature in all variants, however, will be a repeating pattern of regions having effective refractive index that is substantially independent of CD, adjacent to portions formed of product-like features so that the effective refractive index becomes measurably dependent on CD.

The provision of these modified bars 316 adjacent to marks 312, 314 having a different pitch so as to generate a moiré pattern, allows the relatively minor variations in refractive index which are caused by the CD variations to be measured, to be amplified greatly to allow a very sensitive measurement of a CD to be performed using the alignment sensor, as will now be described. The technique relies on a phenomenon that has been used for focus measurement using subdivided or 'chopped' marks, whereby a reduction in the widths of the small features causes an apparent shift in the position of the mark itself. In this way, special chopped targets can be used with an alignment (X-Y position) sensor to measure focus variations (Z). An example of this technique is described in published patent application US 2009135389 A1.

Figure 6:
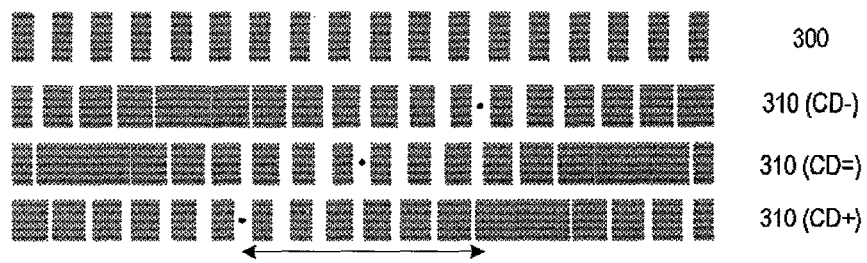
FIG. 6 shows schematically a CD-sensitive moiré pattern detected by the alignment sensor when observing the modified mark.

FIG. 6 illustrates visually how CD variation can be identified and measured using the modified mark 310. The shaded bars in each line represent peaks in the intensity waveform, measured during the scanning of the mark by the apparatus. In the top line of FIG. 6, corresponding to the conventional target 300, a simple repeating pattern with a pitch corresponding to that of the bars 302 in mark 300 is observed. This corresponds to the simple sine waves we have seen in the middle portion of the trace of FIG. 4. Below that, the patterns observed when scanning the modified mark 310 with different CD values are illustrated. The moiré pattern, comprising a much slower variation defined by the beating effect between the spatial frequencies of the inner and outer sets of bars, has its brightest point indicated by a spot. As the effective refractive index of the subdivided portions of the bars 316 rises and falls with a CD, so the effective position of those bars, as perceived by the alignment sensor, shifts from a nominal position towards the left, or towards the right, relative to the unmodified bars 312, 314. Although this shift in itself may be very small, the difference in pitch between the bar patterns in the different portions of mark 310 is such that the peak of the moiré pattern, indicated by a spot in each line in FIG. 6, moves a much greater distance. This is the principle by which the alignment sensor with the modified mark can be used to make a very sensitive measurement of the CD.

Figure 7:
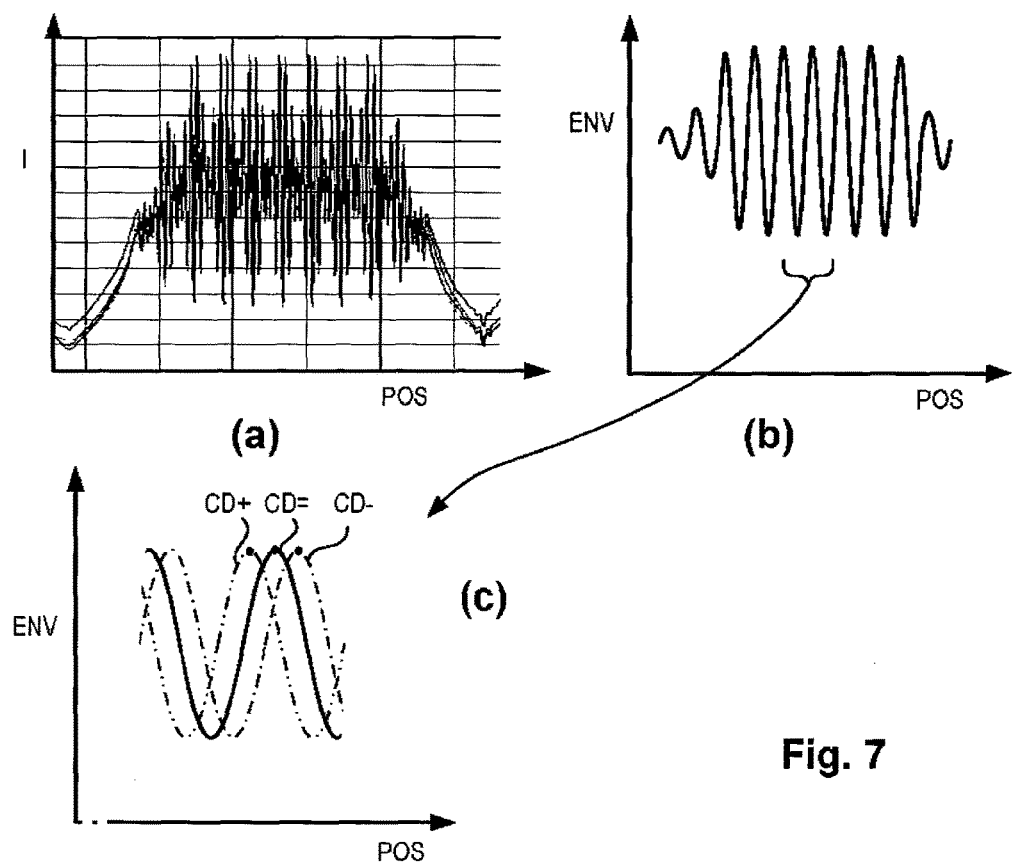
FIG. 7 illustrates signals and signal processing performed to obtain CD measurements from the modified mark using the alignment sensor of FIG. 3.

FIG. 7(a) illustrates a trace obtained from the modified mark 310, to be contrasted with the conventional trace shown in FIG. 4. In fact, in FIG. 7(a), four traces are superimposed upon one another, taken at different wavelengths. These wavelengths may, for example be green, red, near infrared (NIR) and far infrared (FIR) wavelength. All the traces show a fine periodic behavior (corresponding to that shown in FIG. 4), but modified with a lower frequency envelope, indicating the moiré pattern. As indicated in the trace in (a), the length and number of bars in the mark, together with the difference in their pitch (spatial frequency), is such that there are several cycles of the moiré pattern to be observed while traversing the mark. As shown in FIG. 7(b), this allows a sine wave envelope ENV to be fitted to the observed trace with a high accuracy. Because the individual pitches within the mark 310 are known accurately, their beat frequency is also well known, and the fitting operation can provide an accurate indication of the phase of the moiré pattern (envelope). The apparent positional variation of the moiré pattern is an amplified version of the positional variation caused by CD variation in the substrate under test. The amplification factor can be calculated as $m=(p1+p2)/2(p1-p2)$, where p1 and p2 are the pitches of the bar structures 312/314 and 316 respectively as indicated in FIG. 5(b).

The choice of pitches and amplification factors depends on the designer's knowledge of the measuring apparatus, and also involves a compromise between the number of cycles in the moiré pattern that can be observed, and the amplification factor desired. One way to calculate good pitches to use would be start off with a common pitch, for example 22 µm, then determine the desired amplification factor, for example 10. From this, the two pitches to be combined follow as being pitch 1: 22/10=2.2 µm and pitch 2: 22/(10+1)=2 µm. Note that from the 22 µm pitch in the physical mark, an 11 µm detectable sine pattern will result in the self-interference type of sensor shown in FIG. 3.

Figure 8:
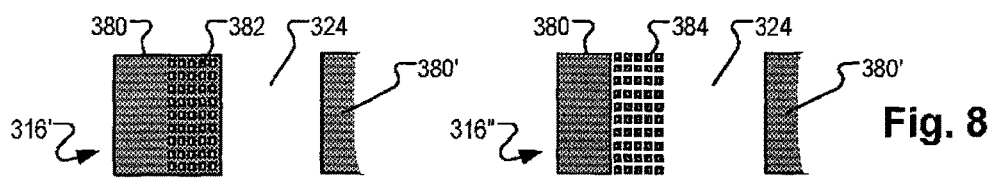
FIG. 8 shows details of alternative forms of modified marks, useful for measuring CD of different types.

Referring to FIG. 8, the sub-divided portions of bars 316 need not be bars 322 lying parallel to the general direction of the bars 312, 316 etc. They can be designed to emulate any kind of product feature, whose critical dimension is desired to be measured. In an example illustrated as 316', a solid portion of the bar 316' is labeled 380. Rather than being sub-divided into a number of smaller parallel bars 322 as in FIG. 5, this bar 316' is provided with a pattern corresponding to small square features, sub-divided in both X- and Y-dimensions. These product-like features 382 may correspond for example to through-holes in a product layer, by which electrical contact is made between conductors or semiconductor materials in different device layers formed on the substrate. The CD and CD uniformity of such features can be of great importance to the performance and reliability of the lithographic process as a whole. Similarly, in another example mark, the bar 316" has a sub-divided portion comprising discrete small squares labeled 384, corresponding to pillars in the resist or product layer.

Figure 9:
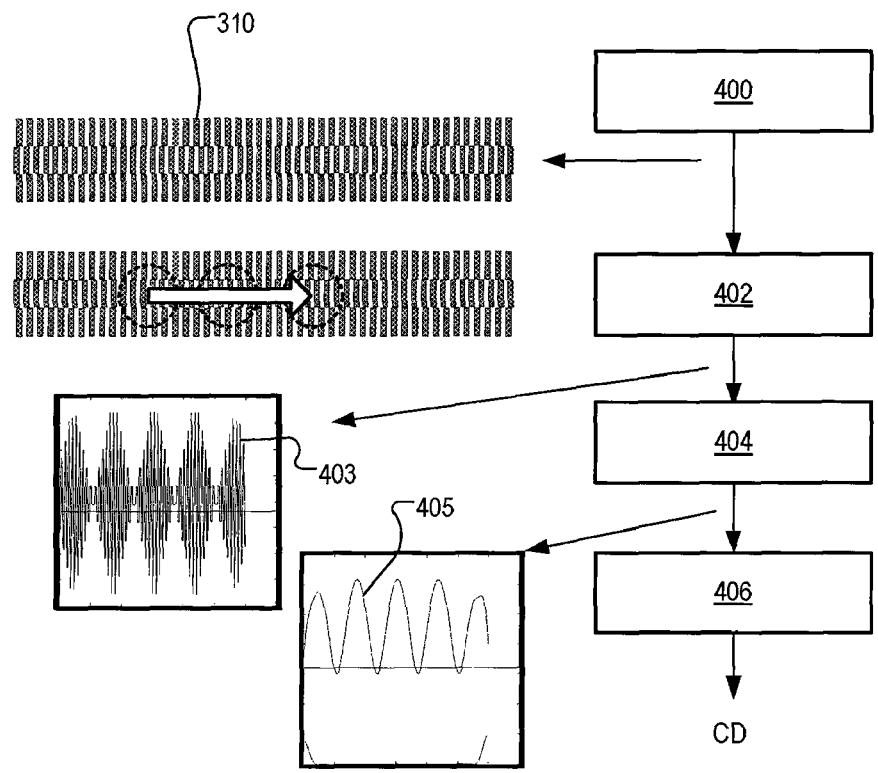
FIG. 9 is a flow chart with accompanying diagram illustrating the process of measuring CD using the mark of FIG. 5.

FIG. 9 is a flow chart and illustrative material showing the complete process for measuring CD on a substrate using the position alignment system. At 400 a mark is formed on the substrate, and in the form of mark 310 or similar. At 402 the mark is scanned using the alignment sensor. Positional information X and/or Y may be obtained from the same mark, or it may be that such information is obtained in a separate step. Where position is measured, this may be the coarse or fine stage of a positional measurement. By measuring CD using the coarse measurements. Mark 310 may be a replacement for one of the "normal" marks provided for positional sensing and wafer grid mapping, or it may be an additional mark dedicated to the CD measurement. Where marks are provided on a substrate for both coarse and fine positional measurements, the modified mark may be substituted for one of the coarse marks, so as not to degrade performance in the fine measurement step. The measurement apparatus used is assumed in this description to be the existing alignment sensor of a lithographic apparatus, as described above and below, but it could be a separate sensor. If it is a separate sensor, it may have other functions as well, or be dedicated to this purpose. It may be integrated in the lithography apparatus, or in some other test apparatus, or it may be quite separate.

The output of step 402, as illustrated by trace 403 is indicative of a beating effect between the individual periodic signals provided by the inner and outer bars of the mark 310 (or a similar mark). Therefore relatively high frequency variations are observed, within a lower-frequency envelope. At 404, an envelope-fitting function is applied to trace 403 to obtain and measure the envelope trace illustrated at 405. As mentioned, positional information about the mark may be obtained in the conventional manner at the same time, according to choice. A suitable envelope-fitting transform is the Hilbert transform, but of course any suitable method may be used, based for example on a suitable windowing operation and a Fourier transform. At 406, from the fitted envelope curve, the phase of the curve is measured and mapped against a calibrated table of CD variations, to output a CD measurement.

Application to Improve CD Matching Between Process Steps

Figure 10:
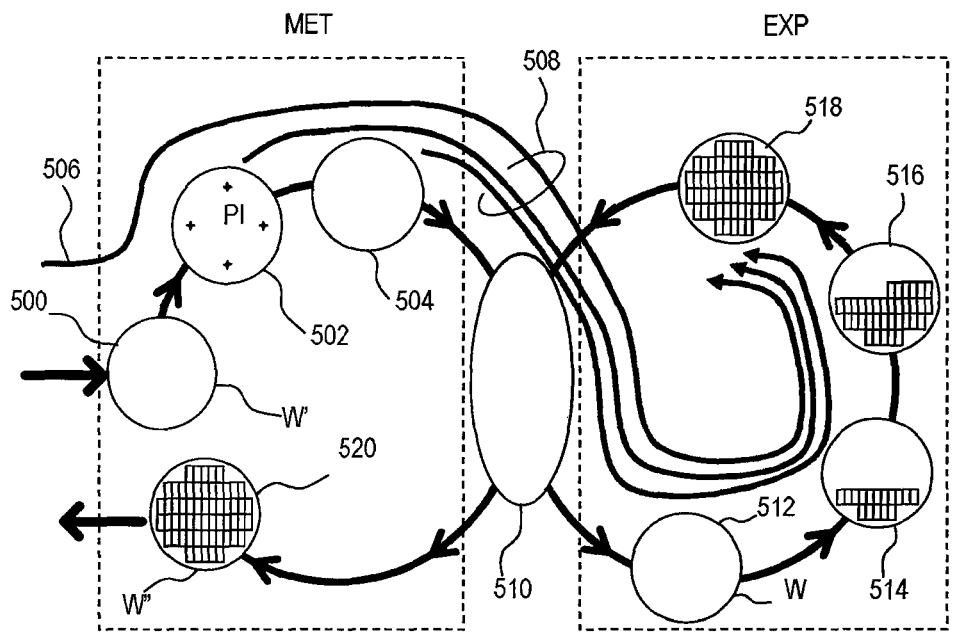
FIG. 10 illustrates schematically the stages in the measurement and exposure processes in the apparatus of FIG. 1.

FIG. 10 illustrates the sequence of steps performed in the dual-stage apparatus of FIG. 1 to expose dies on a substrate W. The same sequence can be adapted to a single-stage apparatus. On the left hand side within a dotted box are steps performed at a measurement station MEA, while the right hand side shows steps performed at a exposure station EXP. As described above in relation to FIG. 1, the measurement station represents the general location of the sensors AS, LS, where substrate table WTb is currently stationed, while exposure station EXP is the location under the projection system PS where substrate table WTa is currently located.

The operating sequence of the apparatus is repetitive, to process a succession of substantially identical substrates. We shall begin our description of the process when a substrate W has already been loaded into the exposure station, as shown in FIG. 1 also. At 500, a new substrate W' is loaded to the apparatus by a mechanism not shown. These two substrates W and W' are processed in parallel in order to increase the throughput of the lithography process as a whole. Referring initially to the newly-loaded substrate W', this may be a previously unprocessed substrate, prepared with a new photo resist for first time exposure in the apparatus. In general, however, the lithography process described will be merely one step in a series of exposure and processing steps, so that substrate W' has been through this apparatus and/or other lithography, several times already, and may have subsequent processes to undergo as well. In the particular context of the present invention, it may have features on it whose CD is to be measured. At 502, alignment measurements using the substrate marks P1 etc. and alignment sensor AS are performed to measure and record alignment of the substrate relative to substrate table WT. In practice, several marks across the substrate W' will be measured, to establish a "wafer grid", which maps very accurately the distribution of marks across the substrate, including any distortion relative to a nominal regular grid. Using the methods described already above, CD measurements are also made using a modified mark or marks of the form illustrated in FIG. 5 using the same alignment sensor AS. At step 504, a map of wafer height against X-Y position is measured also, for use in accurate focusing of the exposed pattern.

When substrate W' was loaded, recipe data 506 were received, defining the exposures to be performed, and also properties of the wafer and the patterns previously made and to be made upon it. To these recipe data are added the measurements made at 502, 504, so that a complete set of recipe and measurement data 508 can be passed to the exposure station. At 510, wafers W' and W are swapped, so that the measured substrate W' becomes the substrate W entering the exposure station. This swapping is performed by exchanging the supports WTa and WTb within the apparatus, so that the substrates W, W' remain accurately clamped and positioned on those supports, to preserve relative alignment between the supports and the substrates themselves. Accordingly, once the tables have been swapped, determining the relative position between projection system PS and substrate table WTa (formerly WTb) is all that is necessary to make use of the measurement information 502, 504 for the substrate W (formerly W') in control of the exposure steps. At step 512, reticle alignment is performed using the mask alignment marks M1, M2 (FIG. 1). In steps 514, 516, 518, scanning motions and radiation are applied at successive die locations across substrate W, in order to complete the exposure of a number of patterns. Thanks to the alignment and level map data, these patterns are accurately aligned with respect to desired locations, and, in particular, with respect to features previously laid down on the same substrate. Thanks to the CD data, the parameters of exposure and/or processing can be set with the aim of making the CD of the applied pattern well-matched to the CD in the existing features, rather than aiming at an arbitrary or ideal value of CD. The exposed substrate, now labeled W" is unloaded from the apparatus at step 520, to undergo etching or other processes, in accordance with the exposed pattern.

The CD technique just described can be applied wherever a CD measurement is desired, and a suitable mark can be applied in the layer (device layer or resist layer) in which CD is to be measured. A particular benefit of the method is that the measurement can be performed rapidly using position sensors, such as the alignment sensors which are typically available in a lithographic apparatus and which are used to measure position of a substrate which is provided already with some features and is about to be exposed to form additional features. A situation of this type in which knowledge of CD would be particularly useful is in the so-called double patterning technique, of which various sub-types exist. In double-patterning, a first pattern provides a 'first population' of lines defining product features having the critical (smallest manufacturable) dimension. To increase the density of product features, a second population of lines is interleaved as precisely as possible between, using the same or similar lithographic apparatus.

The accurate placement of these second lines with an even spacing between the first lines assumes extremely good overlay performance of the lithographic apparatus process. However, it is also generally very important to the satisfactory performance of the lithographic process, and ultimately the device, if the dimensions of the features in the first and second populations are well matched on a given substrate or substrate portion. That is to say, it may be more important for a given application that the CDs in the first and second populations are well matched to one another, than it is that they are well matched to an ideal value. Much effort and technology has been devoted to achieving predictable CD performance for double patterning and lithography generally. The novel measurement technique described herein provides an opportunity to measure actual CD in an existing product layer comprising the first population, in preparation for patterning for a second population. Using the result of this measurement allows that any deviation that has occurred in the CD of the first population can be matched by an adjustment (offset) in the desired CD of the second population.

Alternative Embodiment to Measure Overlay

Figure 11:
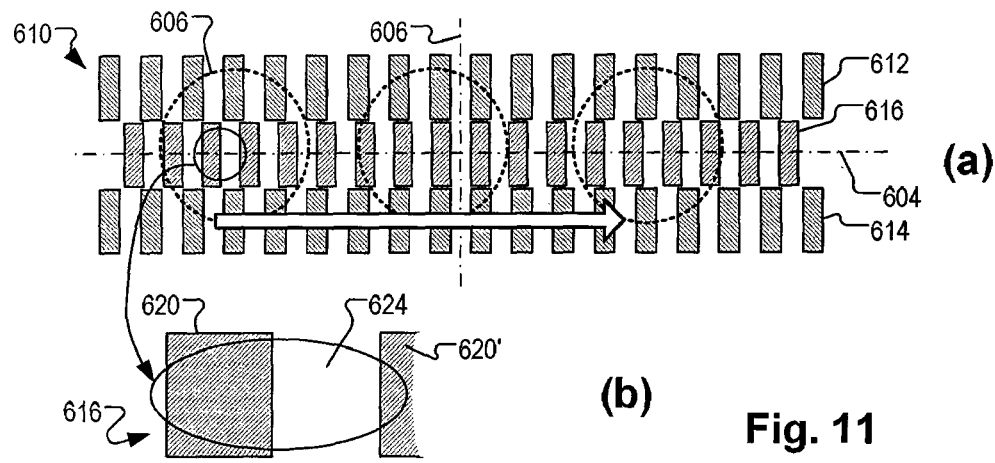
FIG. 11 illustrates a second modified form of mark useful for measuring overlay using the alignment sensor of FIG. 3.
Figure 12:
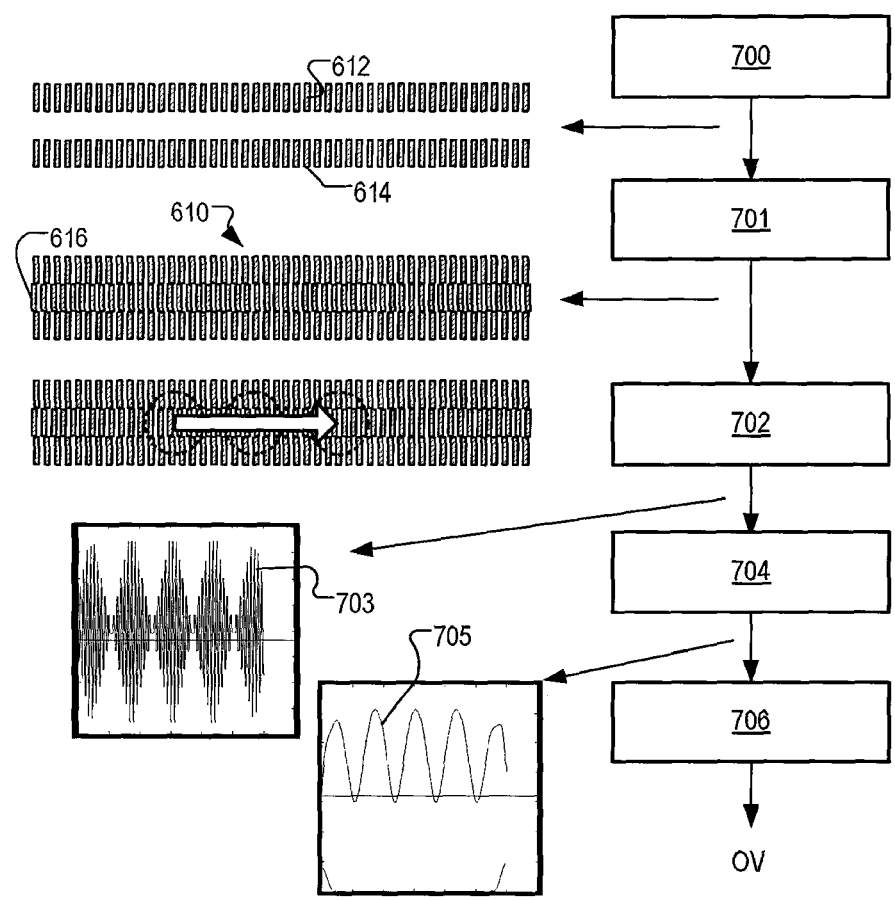
FIG. 12 is a flow chart of a method of measuring overlay using the mark of FIG. 11 and the alignment sensor of FIG. 3.

FIGS. 11 and 12 illustrate the application of techniques similar to those described above, for the measurement of overlay, that is the positioning error between two layers (patterning steps) performed at different times on the same substrate. FIG. 11(a) shows a mark 610 which is superficially identical to the mark 310 described above for the measurement of CD. Features of this mark are labeled with a similar reference numbers to those in the mark 310, but prefixed with a 6 instead of a 3. As discussed above, this particular arrangement, being symmetrical about the axes 604, 606 is particularly suitable for one type of alignment sensor. Other layouts, which may include only two arrays of bars (612, 616) can also be envisaged.

FIG. 11(b) shows a detail of a bar 616 in the central portion of mark 610. In contrast to the mark 316 used for CD measurement, the central array of bars 616 in this example comprises simple marks 620 and spaces 624, without subdivisions. The major difference between the bars 616 in the central portion and the bars 612, 614 in the outer portions is that they are formed in separate process steps, for example in separate product layers. Because of the difference in pitch between the different sets of bars 612/614 and 616 respectively, a moiré pattern will again appear when radiation scattered by both sets of bars is combined in the alignment sensor. With an overlay error of zero, the positions of the bars 616 relative to the bars 612, 614 may be exactly as shown in FIG. 11(a). On the other hand, in the presence of an overlay error in the direction of the longitudinal axis 604, the central bars 616 will shift slightly to the left or the right. The moiré pattern will move to left and right in an exaggerated fashion, highlighting the overlay error in a way which is readily measurable by the alignment sensor of the lithographic apparatus.

Accordingly, just as the apparent shift in the central pattern of the bars caused by CD variation in the mark 310 allows a very sensitive measurement of CD to be observed through the moiré pattern, so the actual movement of the central bars 616 in the mark 610, caused by an overlay error, will allow a sensitive observation of overlay performance through movement of the moiré pattern.

FIG. 12 is a flow chart of the process for overlay measurement. The process steps 700 etc. correspond closely to the steps 400 etc. of FIG. 9, and like numbers are applied. There is a difference however in the initial process of creating the mark. At 700, during a first lithographic step, bars 612 and 614 having a first pitch are printed as part of the pattern applied to a substrate W from a patterning device M in a lithographic apparatus. In a second lithographic process step 701, a different (part of) patterning device M is used in the lithographic apparatus (or in another, similar apparatus) to apply a second pattern on the same substrate W, overlying the first pattern. This second pattern includes the bars 616 of mark 610, having a different pitch than the bars 612 and 614, to complete the mark 610.

At 702 the mark is scanned using the alignment sensor. Positional information X and/or Y may be obtained from the same mark, or it may be that such information is obtained in a separate step. Where position is measured, this may be the coarse or fine stage of a positional measurement. By measuring overlay using the coarse measurements, one can ensure that the fine measurements are not compromised by the modifications.

The output of step 702, as illustrated by trace 703, is indicative of a beating effect between the individual periodic signals provided by the inner and outer bars. As in FIG. 7, relatively high frequency variations are observed, within a lower-frequency envelope. At 704, an envelope-fitting function is applied to trace 703 to obtain and measure the envelope trace illustrated at 705. As mentioned, positional information about the mark may be obtained in the conventional manner at the same time. A suitable envelope-fitting transform is the Hilbert transform, mentioned above, but of course any suitable method may be used. At 706, from the fitted envelope curve, the phase of the observed curve is measured and calculated back into an overlay measurement, taking into account the moiré amplification factor.

Clearly many variations are possible within this embodiment, including many of the same variations as discussed in relation to the CD-measurement method described previously. The different portions of mark 610 can be created in a different order, for example with the central bars 616 being printed before the outer bars 612, 614. Multiple marks can be formed on the same substrate for measuring overlay and CD, and for measuring overlay and/or CD at different product layers.

In a numerical example, the inner array of bars 616 has a pitch of 2.2 µm, while the pitch of the outer bars 612, 614 is 2.6 µm. The theoretical amplification factor resulting from the moiré pattern is (2.6+2.2)/(2(2.6−2.2))=6. Therefore, if the shift between the two sets of bars would be 1 nm, the shift of the envelope detected in step 704 would be 6 nm. Similarly, a shift of 3 nm would result in a shift of the envelope of 18 nm. The amplification factor provided by the moiré mark therefore may allow a much more sensitive measurement of overlay error than could be obtained using the alignment sensor AS by itself to measure different marks, and also may allow for using a single measurement step. Furthermore, to measure overlay by simply measuring the positions of two marks formed in different layers, the result would be subject to an uncertainty which is twice the measurement uncertainty of the individual position measurements. The moiré method proposed above does not accumulate errors in this way. The choice of pitches and amplification factors depends on the designer's knowledge of the measuring apparatus, and also involves a compromise between the number of cycles in the moiré pattern that can be observed and the amplification factor. The same principles can be applied as in the CD-measurement method described above.

The method illustrated has an additional advantage over alternative overlay measurement techniques, in that the patterns made in the two process steps 700, 701 are compared in their positions without being physically overlaid one on the other. While the actual product features whose overlay accuracy is important will of course be formed on top of one another, the fact that the bars 612/614 and 616 are formed side-by-side for the present measurement technique means that the overlay measurement is free of other influences, caused by wafer-level interaction between the layers.

Since overlay is the determination of the difference of two positions, it may also be required to define a reference position for the measurement. Several solutions are available for this. A first option is to use one of the pitches of a part of the combined mark, that is the position of an array of bars 612 or 614, or 616. Assuming that this pitch can be identified using the instrument, this means a single scan step 702 can be used to determine overlay and absolute position. The Hilbert transform, for example, can be used to identify the position of the individual pitches within the beat pattern, as well as the envelope of the beat pattern itself. Alternatively, an additional mark looking like mark 610 but having all the bars in one of the layers can be printed alongside the overlay measuring mark 610. In that case, the moiré patterns of the two marks can be compared, one with a known zero overlay error (and hence a measurable position) and the other with the shift resulting from the displacement between the patterns applied in step 700 and 701. As a further alternative, a mark could be printed in one of the steps 700 or 701, which has a pitch corresponding to the resulting envelope of the combined mark.

In the examples illustrated, the two sets of bars are designed to have more or less equal weighting, so that the moiré pattern is as strong as possible. If the same mark is to be used for position measurement, however, a trade-off can be made between the CD or overlay signal strength (moiré signal) and position signal strength. The ratio of the sizes of the different sets of bars can thus be tailored to provide a sufficient moiré signal, without overwhelming a base periodic signal.

Alternative Implementations

The invention can be adapted for use with other types of sensor, besides the ones described in U.S. Pat. No. 6,961,116 and US 2009195768 A, mentioned above. Another type of sensor is described in U.S. Pat. No. 6,297,876, for example, and many alternative designs exist. While in the above examples, the moiré pattern is formed in an optical system which combines radiation from the different portions of the mark, other sensors are based on image capture, followed by digital processing of pixilated images. In those cases, the detected image may look much like the mark 310 or 610, with its discrete bars. The moiré pattern will not be present in the image in the form it is detected, but it can be formed by an image processing step, simply integrating pixel values across the pattern. The image capture can be performed in snapshots, rather than by scanning with illumination spots in the manner of the sensor shown in FIG. 3. Whether the period signal is recorded at once in an image or as a time-varying signal from scanning, the subsequent processing in accordance with the principles described can readily be adapted by the skilled person to achieve the desired result.

Figure 13:
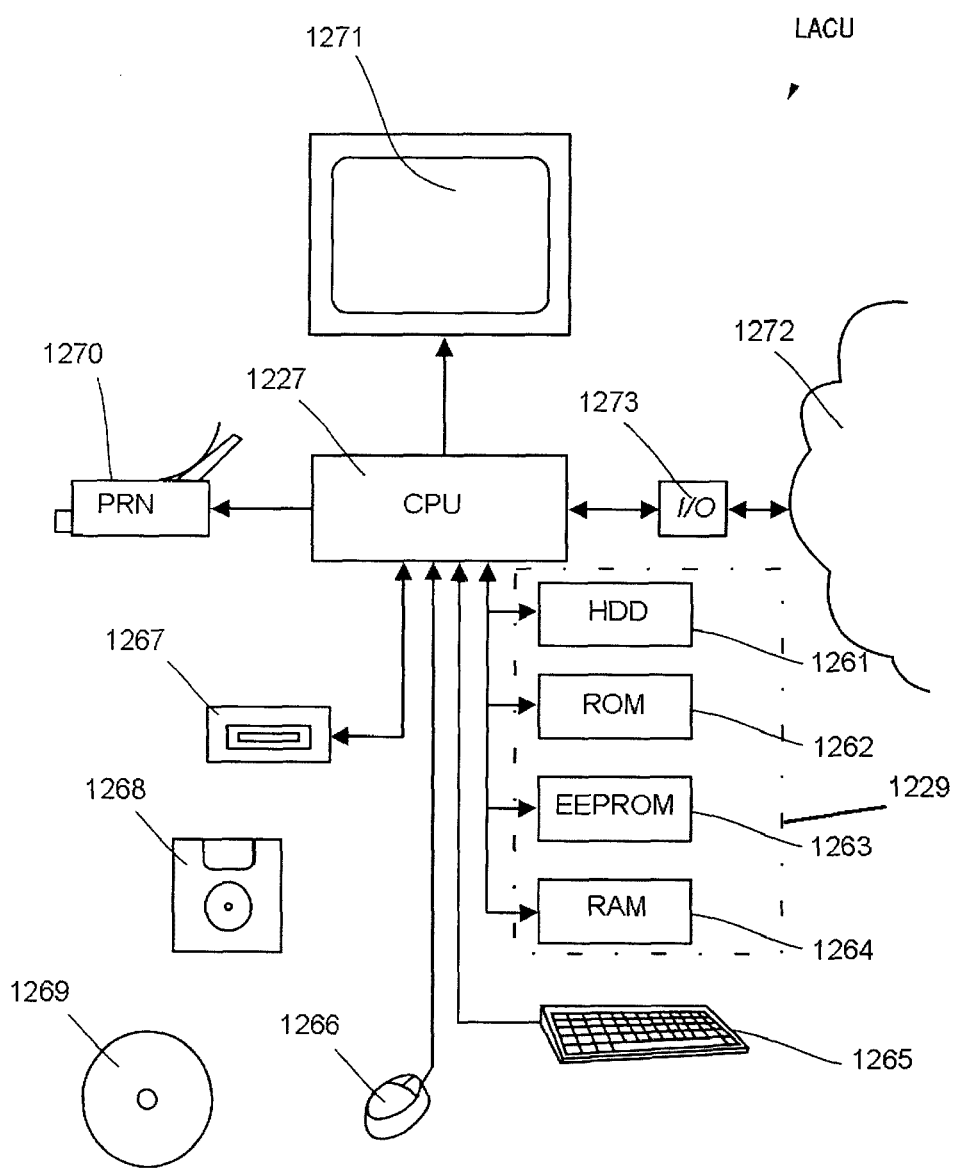
FIG. 13 is a block diagram of an embodiment of a control unit, suitable for use in the methods described above.

It should be understood that the signal processing for calculating the CD and overlay measurements described may make use of a computer assembly as shown in FIG. 13. The computer assembly may be a dedicated computer external to the apparatus, or it may be the unit PU in the alignment sensor or, alternatively, be a central control unit LACU controlling the lithographic apparatus as a whole. The computer assembly may be arranged for loading a computer program product comprising computer executable code. This may enable the computer assembly, when the computer program product is downloaded, to control aforementioned uses of a lithographic apparatus with the alignment sensor AS. Since the techniques described above can be implemented in existing apparatuses without hardware modification, the invention may be effectively embodied in such a computer program product, carrying instructions to control the readout and analysis of signals from the special marks 310, 610 or the like.

Memory 1229 connected to processor 1227 may comprise a number of memory components like a hard disk 1261, Read Only Memory (ROM) 1262, Electrically Erasable Programmable Read Only Memory (EEPROM) 1263 en Random Access Memory (RAM) 1264. Not all aforementioned memory components need to be present. Furthermore, it is not essential that aforementioned memory components are physically in close proximity to the processor 1227 or to each other. They may be located at a distance away The processor 1227 may also be connected to some kind of user interface, for instance a keyboard 1265 or a mouse 1266. A touch screen, track ball, speech converter or other interfaces that are known to persons skilled in the art may also be used.

The processor 1227 may be connected to a reading unit 1267, which is arranged to read data, e.g. in the form of computer executable code, from and under some circumstances store data on a data carrier, like removable disk 1268 or a CDROM 1269. Also DVDs or other data carriers known to persons skilled in the art may be used.

The processor 1227 may also be connected to a printer 1270 to print out output data on paper as well as to a display 1271. The processor 1227 may be connected to a communications network 1272, for instance a public switched telephone network (PSTN), a local area network (LAN), a wide area network (WAN) etc. by means of transmitters/receivers 1273 responsible for input/output (I/O). The processor 1227 may be arranged to communicate with other communication systems via the communications network 1272. In an embodiment of the invention external computers (not shown), for instance personal computers of operators, can log into the processor 1227 via the communications network 1272.

The processor 1227 may be implemented as an independent system or as a number of processing units that operate in parallel, wherein each processing unit is arranged to execute sub-tasks of a larger program. The processing units may also be divided in one or more main processing units with several sub-processing units. Some processing units of the processor 1227 may even be located a distance away of the other processing units and communicate via communications network 1272.

It is observed that, although all connections in FIG. 1 are shown as physical connections, one or more of these connections can be made wireless. They are only intended to show that "connected" units are arranged to communicate with one another in someway. The computer system can be any signal processing system with analogue and/or digital and/or software technology arranged to perform the functions discussed here.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

The invention claimed is:

1. A method of measuring a parameter of performance of a lithographic process, the method comprising:

(a) forming a pattern on a substrate using at least one lithographic step, the pattern including first and second sub-patterns positioned horizontally adjacent one another on the substrate in a direction parallel to a surface of the substrate and perpendicular to a scanning direction, and having respective first and second periodicities;

(b) making observations of the adjacent first and second sub-patterns by scanning, with a single scanning spot, at least a portion of each of the first and second sub-patterns to obtain a combined signal including a beat component having a third periodicity at a frequency lower than that of the first and second periodicities, the beat component generated by interference between signals produced by diffraction from the first and second sub-patterns; and (c) calculating from said combined signal a measurement of performance of the lithographic process, the calculated measurement being determined at least partially by a phase of the beat component.

2. A method as claimed in claim 1 wherein said first and second sub-patterns are both formed in the same lithographic step, and wherein at least one of said sub-patterns is formed so as to have an apparent position, relative to the other sub-pattern, which is dependent on said performance parameter.

3. A method as claimed in claim 2, wherein said performance parameter is the dimension of a certain feature type formed on said substrate in said lithographic step.

4. A method as claimed in claim 1, wherein at least one of said sub-patterns comprises a periodic array of marks and wherein each of said marks has a solid portion and a subdivided portion, the apparent position of each mark when observed in step (b) being dependent on said performance parameter of the lithographic process.

5. A method as claimed in claim 1, wherein said first and second sub-patterns are formed in separate lithographic steps.

6. A method as claimed in claim 5, wherein said performance parameter is overlay.

7. A method as claimed in claim 1, wherein in the step (b) observations of the first and second sub-patterns are combined optically and converted into an electronic signal that already includes the beat component.

8. A method as claimed in claim 7, wherein said pattern is observed by scanning the pattern with a sensor to generate said electronic signal, such that said beat component appears during said scanning as a time varying component in said electronic signal.

9. A method as claimed in claim 1, wherein in step (b) observations of the first and second patterns are made simultaneously and converted into first and second electronic signals which are then combined electronically to obtain said combined signal.

10. An apparatus for measuring a parameter of performance of a lithographic process, the apparatus comprising:

a sensor operable to observe a pattern on formed on a substrate using said lithographic process, the pattern including first and second sub-patterns positioned horizontally adjacent one another on the substrate in a direction parallel to a surface of the substrate and perpendicular to a scanning direction, and having respective first and second periodicities;

an arrangement for combining observations of the adjacent first and second sub-patterns by scanning, with a single scanning spot, at least a portion of each of the first and second sub-patterns to obtain a combined signal including a beat component having a third periodicity at a frequency lower than that of the first and second periodicities, the beat component generated by interference between signals produced by diffraction from the first and second sub-patterns; and a processor for calculating from said combined signal a measurement of performance of the lithographic process, the calculated measurement being determined at least partially by a phase of the beat component.

11. An apparatus as claimed in claim 10 wherein in operation said observations of the first and second sub-patterns are combined optically before being converted into an electronic signal that already includes the beat component.

12. An apparatus as claimed in claim 11 wherein said sensor is arranged to make said observations by scanning the pattern to generate said electronic signal, such that said beat component appears during said scanning as a time varying component in said electronic signal.

13. An apparatus as claimed in claim 10 wherein in said combining arrangement is arranged to obtain observations of the first and second patterns in the form of first and second electronic signals and to combing the first and second electronic signals to obtain said combined signal.

14. A substrate whereon a mark has been formed by a lithographic process, the mark being adapted for use in measuring a parameter of performance of the lithographic process and comprising first and second sub-patterns positioned horizontally adjacent one another on the substrate within a region sized to allow a single scanning spot to simultaneously scan at least a portion of each of the first and second sub-patterns in a direction parallel to a surface of the substrate and perpendicular to a scanning direction, and having respective first and second periodicities, wherein said sub-patterns are formed such that an apparent position of one sub-pattern relative to the other sub-pattern is dependent on said performance parameter, and wherein said first and second periodicities are such as to generate a beat pattern having a third periodicity at a frequency lower than that of the first and second periodicities, the beat component generated by interference between signals produced by diffraction from the first and second sub-patterns, whereby variation of said performance parameter can be inferred a variation in the position of the beat pattern.

15. A substrate as claimed in claim 14 wherein said first and second sub-patterns are both formed in the same lithographic step, and wherein at least one of said sub-patterns is formed so as to have an apparent position, relative to the other sub-pattern, which is dependent on said performance parameter.

16. A substrate as claimed in claim 15 wherein said performance parameter is the dimension of a certain feature type formed on said substrate in said lithographic process.

17. A substrate as claimed in claim 14, wherein at least one of said sub-patterns comprises a periodic array of bars and wherein each of said bars has a solid portion and a subdivided portion, the apparent position of each bar when observed being dependent on said performance parameter of the lithographic process.

18. A substrate as claimed in claim 14, wherein said first and second sub-patterns have been formed in separate lithographic steps, and said performance parameter is overlay.

19. A substrate as claimed in claim 14 wherein said first and second sub-patterns extend side-by-side in a longitudinal direction of the pattern.

20. A substrate as claimed in claim 19 wherein a first one of said first and second sub-patterns extends along a centerline of the pattern, while the other one of said first and second sub-patterns extends along both sides such that the pattern as a whole is symmetric about said centerline.

* * * * *